（12） United States Patent
Lee et al.

(10) Patent No.: US 12,082,425 B2
(45) Date of Patent: Sep. 3, 2024

(54) EFFICIENT FABRICATION OF MEMORY STRUCTURES

(71) Applicant: Micron Technology, Inc., Boise, ID (US)

(72) Inventors: Don Koun Lee, Boise, ID (US); Kevin Lee Baker, Boise, ID (US); Lei Wei, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 18/124,438

(22) Filed: Mar. 21, 2023

(65) Prior Publication Data
US 2023/0225137 A1 Jul. 13, 2023

Related U.S. Application Data

(62) Division of application No. 16/940,774, filed on Jul. 28, 2020, now Pat. No. 11,626,452.

(51) Int. Cl.
*H10B 63/00* (2023.01)
*H10N 70/00* (2023.01)
*H10N 70/20* (2023.01)

(52) U.S. Cl.
CPC ........... *H10B 63/84* (2023.02); *H10N 70/063* (2023.02); *H10N 70/231* (2023.02); *H10N 70/826* (2023.02); *H10N 70/841* (2023.02); *H10N 70/882* (2023.02)

(58) Field of Classification Search
CPC ...................................................... H10B 63/84
See application file for complete search history.

(56) References Cited

U.S. PATENT DOCUMENTS

| 8,729,667 | B2 | 5/2014 | Kuniya |
| 10,510,957 | B2 | 12/2019 | Pirovano et al. |
| 2014/0346428 | A1 | 11/2014 | Sills et al. |
| 2015/0155482 | A1 | 6/2015 | Lee |

(Continued)

FOREIGN PATENT DOCUMENTS

TW 201507009 A 2/2015

OTHER PUBLICATIONS

Taiwanese Patent Office, "Office Action and Search Report", issued in connection with Taiwanese Patent Application No. 110126235 dated Jul. 26, 2022 (17 pages).

*Primary Examiner* — Mounir S Amer
(74) *Attorney, Agent, or Firm* — Holland & Hart LLP

(57) ABSTRACT

Methods, systems, and devices for efficient fabrication of memory structures are described. A multi-deck memory device may be fabricated using a sequence of fabrication steps that include depositing a first metal layer, depositing a cell layer on the first metal layer to form memory cells of the first memory deck, and depositing a second metal layer on the cell layer. The second metal layer may be deposited using a single deposition process rather than using multiple deposition processes. A second memory deck may be formed on the second metal layer such that stacked memory cells from the first and second deck share the use of the second metal layer. Using a single deposition process for the second metal layer may decrease the quantity of fabrication steps used to fabricate the multi-deck memory array and reduce or eliminate the exposure of the cell material to metal etchants.

19 Claims, 9 Drawing Sheets

(56) References Cited

U.S. PATENT DOCUMENTS

2017/0117327 A1  4/2017  Terai
2019/0036022 A1  1/2019  Pirovano et al.
2019/0386201 A1* 12/2019  Yang .................... H10B 61/00

* cited by examiner

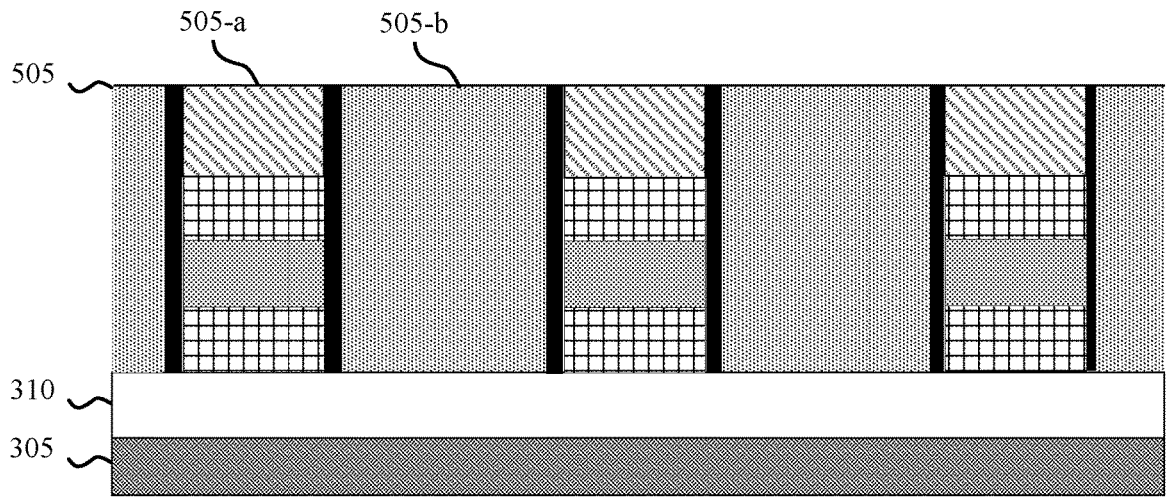
FIG. 5A
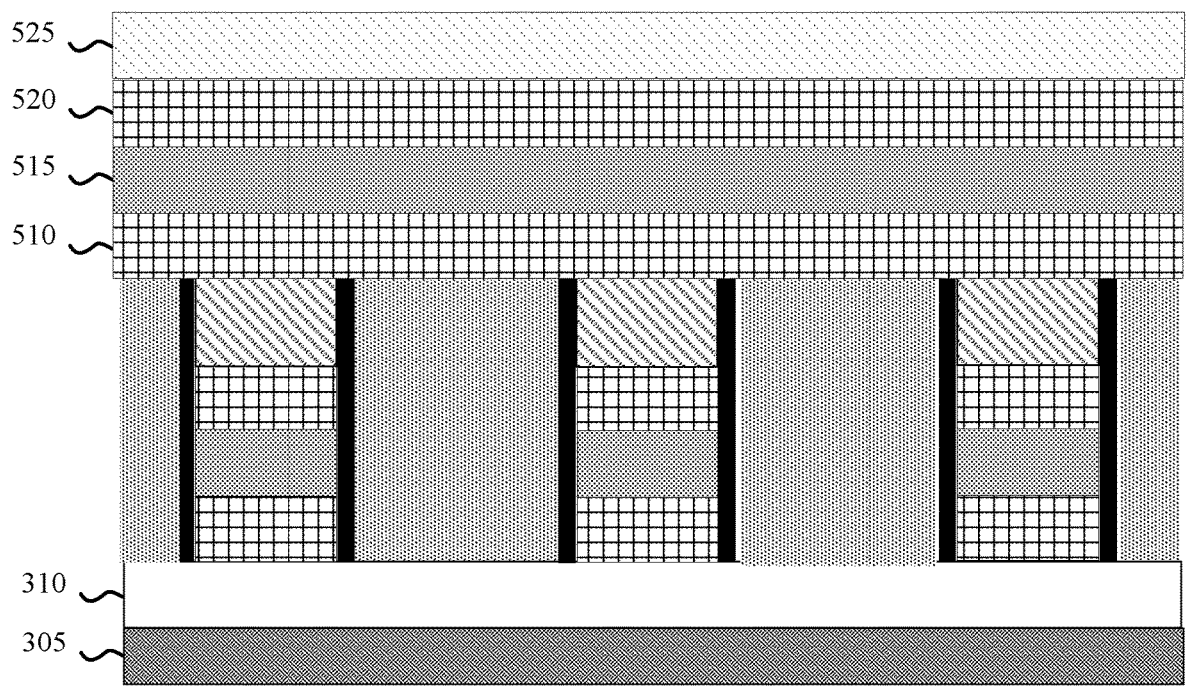
FIG. 5B
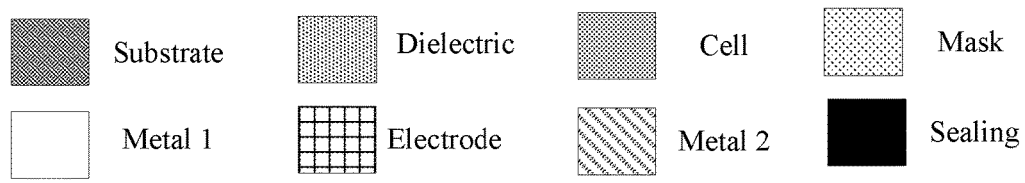

EFFICIENT FABRICATION OF MEMORY STRUCTURES

CROSS REFERENCE

The present Application for Patent is a divisional of U.S. patent application Ser. No. 16/940,774 by Lee et al., entitled "EFFICIENT FABRICATION OF MEMORY STRUCTURES," filed Jul. 28, 2020, assigned to the assignee hereof, and is expressly incorporated by reference in its entirety herein.

BACKGROUND

The following relates generally to one or more systems for memory and more specifically to efficient fabrication of memory structures.

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

BRIEF DESCRIPTION OF THE DRAWINGS

FIGS. 5A and 5B illustrate examples of cross sections of memory devices that support efficient fabrication of memory structures in accordance with examples as disclosed herein.

DETAILED DESCRIPTION

Figure 1:
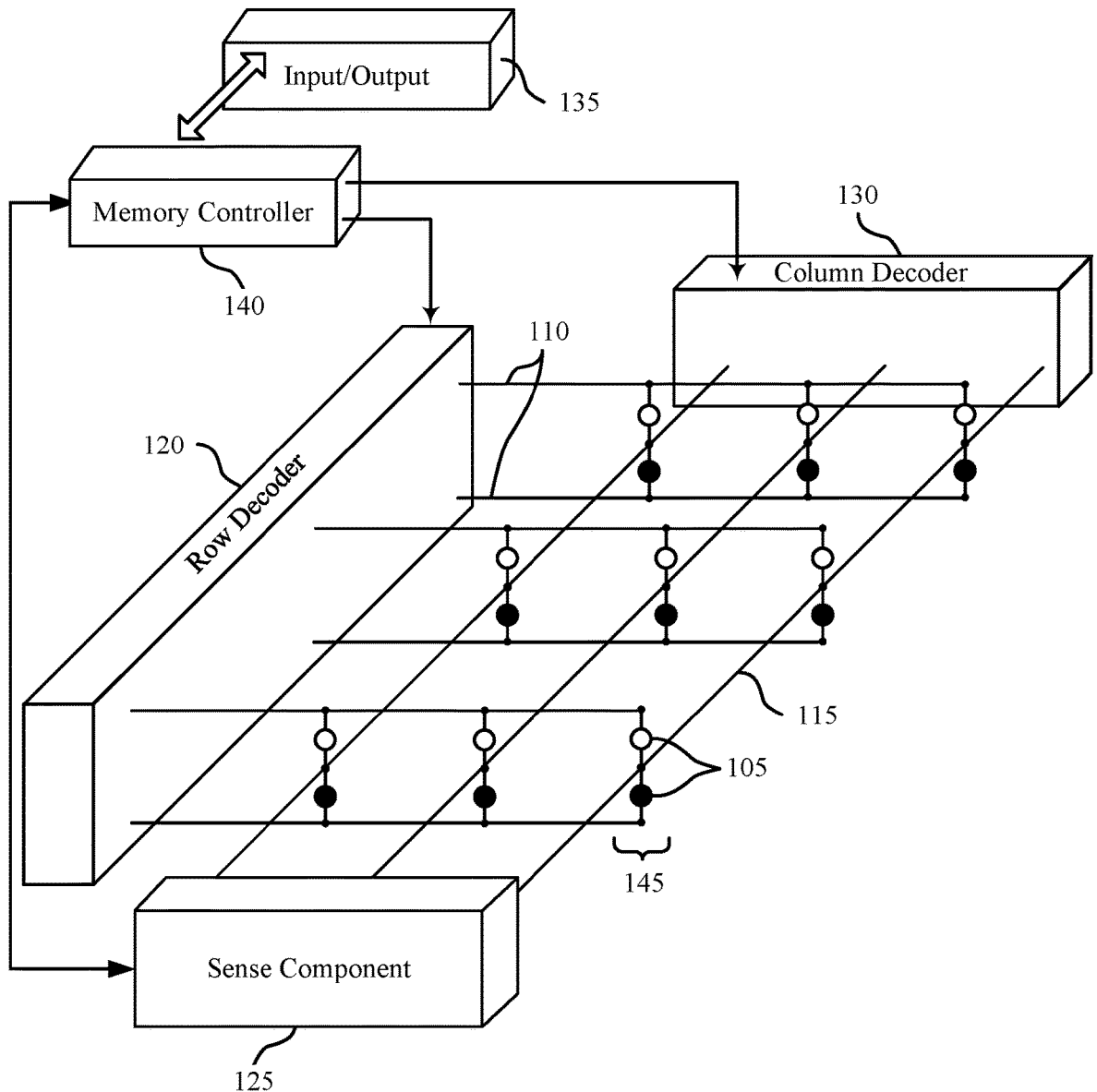
FIG. 1 illustrates an example of a system that supports efficient fabrication of memory structures in accordance with examples as disclosed herein.

A memory device may include multiple memory decks of memory cells such that one array of memory cells may be stacked above, for example on top of, another array of memory cells. Each memory cell may be coupled with various access lines, such as a word line and a bit line, that enable accesses to the memory cell.

Fabrication of a multi-deck memory device may involve multiple steps to deposit and selectively remove various layers of materials. For example, fabricating a memory device may include deposition of metal materials, cell storage materials (e.g., a material that may be used to store a logic state of a memory cell), dielectric materials, sealers, or masks, or any combination thereof, and may include removal steps such as etching or planarization, among other examples, to selectively remove portions of previously deposited materials and to form memory cell structures.

In some multi-deck memory devices, stacked memory cells may be fabricated in a manner such that they share one or more access lines. For example, a first memory cell may be formed between a first metal layer and a second metal layer, and a second memory cell may be formed between the second metal layer and a third metal layer. In such cases, the first memory cell and second memory cell share the access line corresponding to the second metal layer (which may be referred to herein as a middle metal layer). In this manner, the same (middle) metal layer may be used by two decks of memory, thereby reducing the fabrication steps used for fabricating the memory device relative to fabricating separate access lines for multiple decks, for example for every deck.

In general, reducing the quantity of fabrication steps that may be performed may, among other benefits, improve manufacturing efficiency and reduce manufacturing costs. In addition, it may be desirable to develop a sequence of fabrication steps that minimizes the exposure of the cell storage material to removal steps, such as those involving metal etching solutions, after the cell storage material has been deposited.

Some other different approaches for fabricating multi-deck memory devices include fabricating a metal layer using two separate deposition steps to deposit a desired quantity of metal material. That is, a first quantity of metal material of the metal layer may be deposited during a first deposition process, and a second quantity of the metal material of the metal layer may be deposited during a second deposition process. Such an approach may enable the same sequence of fabrication steps to be used for every deck (which may be referred to as stack repetition) and may enable fabrication of a metal layer by performing successive depositions of metal material.

However, such an approach may have drawbacks, including the need for multiple patterning, deposition, and etching steps to form the middle metal layer. Moreover, such an approach may expose deposited call storage material to a metal etching solution, which may degrade the cell storage material and increase the likelihood of fabrication errors or adverse impacts.

As described herein, a fabrication approach that enables a middle metal layer to be formed using a single deposition process may reduce the quantity of fabrication steps and reduce the exposure of the cell material to metal etching solutions, thereby improving fabrication efficiency and yield. In some examples, a quantity of metal deposited during the single deposition process may be greater than a quantity of metal deposited during a first deposition process of a multi-deposition-process approach, which may yield one or more benefits. For example, in line with the present disclosure, a quantity of metal deposited during the single deposition process may be greater than about 55 nm, for example may be about 70 nm, compared to a quantity of metal deposited during a first deposition process of a multi-deposition-process approach that may be about 35 nm or 55 nm. This thicker quantity of metal may yield one or more benefits, such as more efficient communication along the middle metal line.

Features of the disclosure are initially described in the context of memory arrays and structures as described with reference to FIGS. 1 and 2. Features of the disclosure are described in the context cross sections of a memory device as described with reference to FIGS. 3-7. These and other features of the disclosure are further illustrated by and described with reference to a flow diagram and flowchart that relate to efficient fabrication of memory structures as described with reference to FIGS. 8-9.

FIG. 1 illustrates an example memory device 100 in accordance with various embodiments of the present disclosure. Memory device 100 may also be referred to as an electronic memory apparatus and may be included in a memory device. Memory device 100 includes memory cells 105 that are programmable to store different states. Each memory cell 105 may be programmable to store two states, denoted as a logic 0 and a logic 1. In some cases, memory cell 105 is configured to store more than two logic states.

A memory cell 105 may include a material, which may be referred to as a cell storage material, that has a variable and configurable electrical resistance that is representative of the logic states. For example, a crossbar memory cell may a cell storage material in an amorphous state, and that may have a threshold voltage associated with it—that is, current flows after the threshold voltage is exceed. Different threshold voltages may allow SET versus RESET states to be distinguished.

Memory device 100 may include a three-dimensional (3D) memory array, where two-dimensional (2D) memory arrays are formed on top of one another. This may increase the number of memory cells that may formed on a single die or substrate as compared with 2D arrays, which in turn may reduce production costs or increase the performance of the memory array, or both. According to the example depicted in FIG. 1, memory device 100 includes two levels (which may also be referred to, in some examples, as "decks") of memory cells 105 and may thus be considered a three-dimensional memory array; however, the number of levels is not limited to two. Each level may be aligned or positioned so that memory cells 105 may be aligned with one another across each level, forming a memory cell stack 145.

Each row of memory cells 105 is connected to a word line 110, and each column of memory cells 105 is connected to a bit line 115. Word lines 110 and bit lines 115 may be substantially perpendicular to one another to create an array. As shown in FIG. 1, the two memory cells 105 in a memory cell stack 145 may share a common access line such as a bit line 115. That is, a bit line 115 may be in electronic communication with the bottom electrode of the upper memory cell 105 and the top electrode of the lower memory cell 105. Other configurations may be possible, for example, a third layer may share a word line 110 with a lower layer.

As described herein, in some examples, such a shared access line may be fabricated by depositing, using a single deposition process, a metal material to form a metal layer corresponding to the access line.

In general, one memory cell 105 may be located at the intersection of two access lines such as a word line 110 and a bit line 115. This intersection may be referred to as a memory cell's address. A target memory cell 105 may be a memory cell 105 located at the intersection of an activated word line 110 and bit line 115; that is, a word line 110 and a bit line 115 may be activated in order to read or write a memory cell 105 at their intersection. Other memory cells 105 that are in electronic communication with (e.g., connected to) the same word line 110 or bit line 115 may be referred to as untargeted memory cells 105.

As discussed above, electrodes may be coupled to (or part of) a memory cell 105 and may be coupled with a word line 110 or a bit line 115. The term electrode may refer to an electrical conductor, and in some cases, may be employed as an electrical contact to a memory cell 105. An electrode may include a trace, wire, conductive line, conductive layer, or the like that provides a conductive path between elements or components of memory device 100.

Operations such as reading and writing may be performed on memory cells 105 by activating or selecting word line 110 and bit line 115. Word lines 110 may also be known as row lines, and bit lines 115 may also be known digit lines. References to word lines and bit lines, or their analogues, are interchangeable without loss of understanding or operation, and word lines and bit lines may be referred to generally as access lines. Activating or selecting a word line 110 or a bit line 115 may include applying a voltage to the respective line. Word lines 110 and bit lines 115 may be made of conductive materials such as metals (e.g., copper (Cu), aluminum (Al), gold (Au), tungsten (W), etc.), metal alloys, carbon, conductively-doped semiconductors, or other conductive materials, alloys, compounds, or the like.

Accessing memory cells 105 may be controlled through a row decoder 120 and a column decoder 130. For example, a row decoder 120 may receive a row address from the memory controller 140 and activate the appropriate word line 110 based on the received row address. Similarly, a column decoder 130 receives a column address from the memory controller 140 and activates the appropriate bit line 115. For example, memory device 100 may include multiple word lines 110, labeled WL_1 through WL_M, and multiple bit lines 115, labeled BL_1 through BL_N, where M and N depend on the array size. Thus, by activating a word line 110 and a bit line 115, e.g., WL_2 and BL_3, the memory cell 105 at their intersection may be accessed.

Upon accessing, a memory cell 105 may be read, or sensed, by sense component 125 to determine the stored state of the memory cell 105. For example, a voltage may be applied to a memory cell 105 (using the corresponding word line 110 and bit line 115) and the presence of a resulting current may depend on the applied voltage and the threshold voltage of the memory cell 105. In some cases, more than one voltage may be applied. Additionally, if an applied voltage does not result in current flow, other voltages may be applied until a current is detected by sense component 125. By assessing the voltage that resulted in current flow, the stored logic state of the memory cell 105 may be determined. In some cases, the voltage may be ramped up in magnitude until a current flow is detected. In other cases, predetermined voltages may be applied sequentially until a current is detected. Likewise, a current may be applied to a memory cell 105 and the magnitude of the voltage to create the current may depend on the electrical resistance or the total threshold voltage of the memory cell 105.

Sense component 125 may include various transistors or amplifiers in order to detect and amplify a difference in the signals. The detected logic state of memory cell 105 may then be output through column decoder 130 as output 135. In some cases, sense component 125 may be part of a column decoder 130 or row decoder 120. Or sense component 125 may be connected to or in electronic communication with column decoder 130 or row decoder 120.

The memory controller 140 may control the operation (e.g., read, write, re-write, refresh, discharge) of memory cells 105 through the various components, for example, row decoder 120, column decoder 130, and sense component 125. In some cases, one or more of the row decoder 120, column decoder 130, and sense component 125 may be co-located with the memory controller 140. Memory controller 140 may generate row and column address signals in order to activate the desired word line 110 and bit line 115. Memory controller 140 may also generate and control various voltages or currents used during the operation of memory device 100. For example, it may apply discharge voltages to a word line 110 or bit line 115 after accessing one or more memory cells 105. In general, the amplitude, shape, or duration of an applied voltage or current discussed herein may be adjusted or varied and may be different for the various operations discussed in operating memory device 100. Further, one, multiple, or all memory cells 105 within memory device 100 may be accessed simultaneously; for example, multiple or all cells of memory device 100 may be accessed simultaneously during a reset operation in which all memory cells 105, or a group of memory cells 105, are set to a single logic state.

Figure 2:
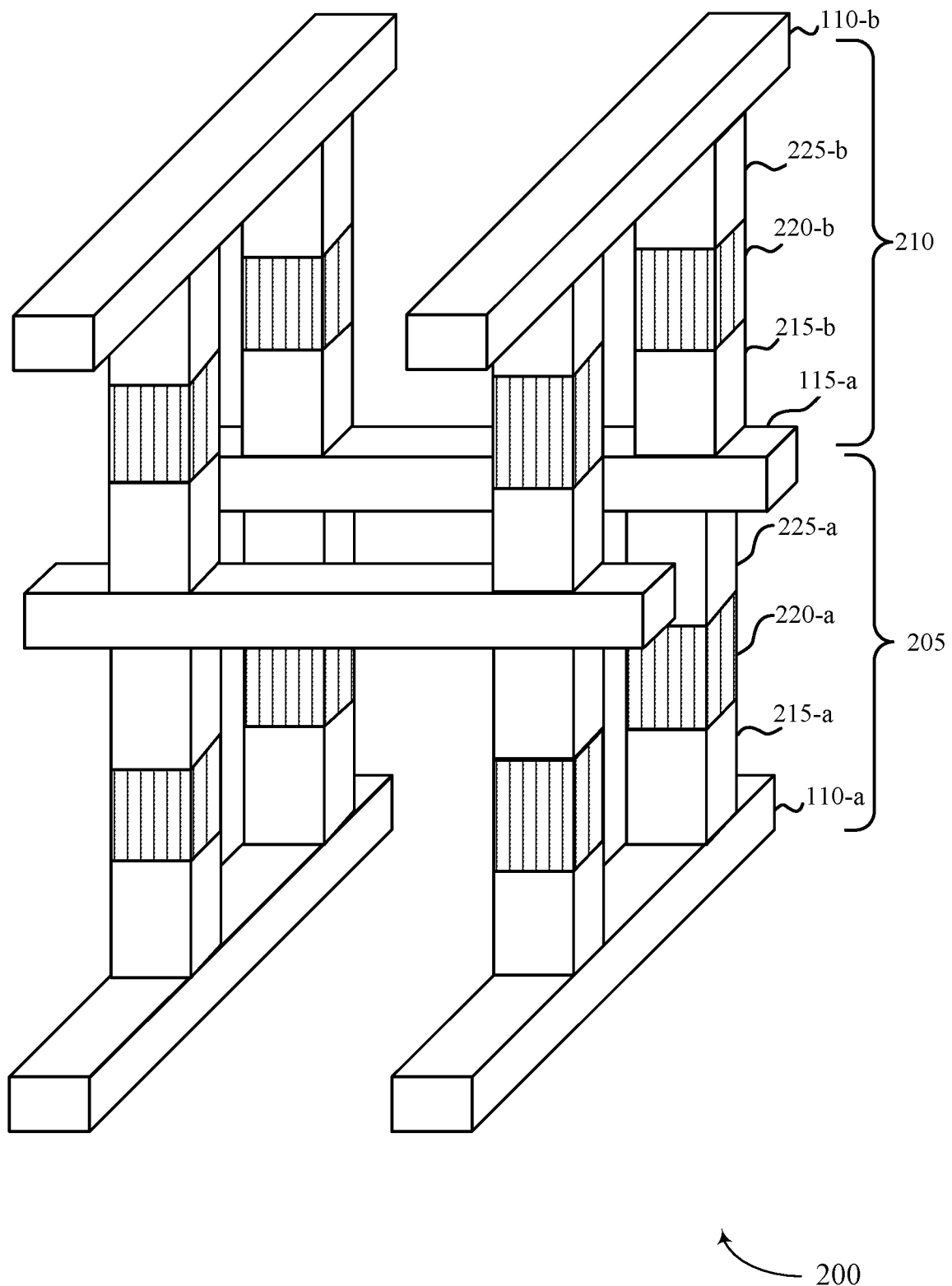
FIG. 2 illustrates an example of a memory die that supports efficient fabrication of memory structures in accordance with examples as disclosed herein.

FIG. 2 illustrates an embodiment of a memory device related to examples described herein. Memory device 200 may be an example of portions of memory device 100 described with reference to FIG. 1. Memory device 200 may include a first array or deck 205 of cells and second array or deck 210 of cells on top of the first array. Memory device 200 may also include word line 110-*a* and word line 110-*b*, and bit line 115-*a*, which may be examples of word line 110 and bit line 115, as described with reference to FIG. 1

Memory cells of the first deck 205 of cells may include portions of a first electrode layer 215-*a*, first cell storage layer 220-*a*, and second electrode layer 225-*a*. Second memory deck 210 may include a separate deck of memory cells, that may include portions of a third electrode layer 215-*b*, second cell storage layer 220-*b*, and fourth electrode layer 225-*b*. In other embodiments, other structures may be fabricated, such as a structure in which one or more electrode (e.g., carbon) layers are defined along one direction (e.g., the WL and/or the BL direction). In some cases, the use of an electrode material may be avoided (e.g., may not be deposited).

In some examples, memory cells of the first deck 205 and memory cells of the second deck 210 may be formed by performing a sequence of fabrication processes to deposit and selectively remove portions of electrode layers, cell storage layers, and, in some cases, layers of other materials.

In some examples, electrode layers 215 may be formed by depositing an electrode material that may include carbon, although other materials may be used for the electrode layers 215, such as any adhesion or barrier layer material (e.g., W, Ti, TiN, Cr, Ni, Ta, etc., or combinations thereof).

In some examples, cell storage layers 220 may be formed by depositing a cell storage material that may include, for example, a chalcogenide glass such as an alloy of selenium (Se), tellurium (Te), arsenic (As), antimony (Sb), carbon (C), germanium (Ge), and silicon (Si). The cell storage material may be used to store a logic state of a memory cell, for example.

The memory cells of the first deck 205 of cells and second deck 210 of cells may, in some examples, have common conductive lines such that corresponding cells of each deck 205 and 210 of cells may share bit lines 115 or word lines 110 as described with reference to FIG. 1. For example, third electrode layer 215-*b* of the second deck of cells and second electrode layer 225-*a* of the first deck 205 of cells may be coupled with bit line 115-*a* such that bit line 115-*a* is shared by vertically adjacent memory cells.

In some examples, bit line 115-*a* may be formed by depositing, in a single deposition process, a metal material to form a metal layer corresponding to bit line 115-*a*.

The architecture of memory device 200 may be referred to as a cross-point architecture. It may also be referred to as a pillar structure. For example, as shown in FIG. 2, a pillar (e.g., first memory deck 205 that includes first memory cells) may be in contact with a first conductive line (e.g., word line 110-*a*) and a second conductive line (e.g., bit line 115-*a*), where pillars of the first memory deck 205 comprise first electrode layer 215-*a*, cell storage layer 220-*a*, and second electrode layer 225-*a*. Correspondingly, pillars of the second memory deck 210 may be in contact with a first conductive line (e.g., bit line 115-*a*) and a second conductive line (e.g., word line 110-*b*) and may include third electrode layer 215-*b*, second cell storage layer 220-*b*, and fourth electrode layer 225-*b*.

Such a pillar architecture may offer relatively high-density data storage with lower production costs compared to other memory architectures. For example, the cross-point architecture may have memory cells with a reduced area and an increased memory cell density compared to other architectures.

Multiple memory cells may be referred to as a memory array. A first memory array may be or may include a first deck of a three-dimensional cross point memory architecture and a second memory array may include a second deck of the three-dimensional cross point memory architecture.

While the example of FIG. 2 shows two memory decks, other configurations are possible. For example, three or four memory decks may be configured in a similar manner in a three-dimensional cross point architecture.

As described in more detail herein, memory device 200 may be made by various combinations of material formation (e.g., deposition) and removal (e.g., etching, planarization). For example, layers of material may be deposited that correspond to the word line 110-*a*, first electrode layer 215-*a*, first cell storage layer 220-*a*, second electrode layer 225-*a*, bit line 115-*a*, third electrode layer 215-*b*, second cell storage layer 220-*b*, fourth electrode layer 225-*b*, and word line 110-*b*. Material may be selectively removed to then create the desired features, such as the pillar structure depicted in FIG. 2, as will be discussed in more detail with respect to FIGS. 3 through 7.

Figure 3:
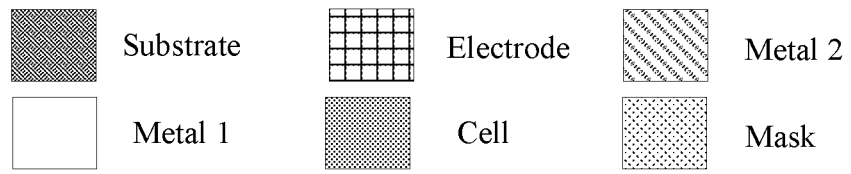
FIG. 3 illustrates an example of a cross section of a memory device that supports efficient fabrication of memory structures in accordance with examples as disclosed herein.
Figure 3:
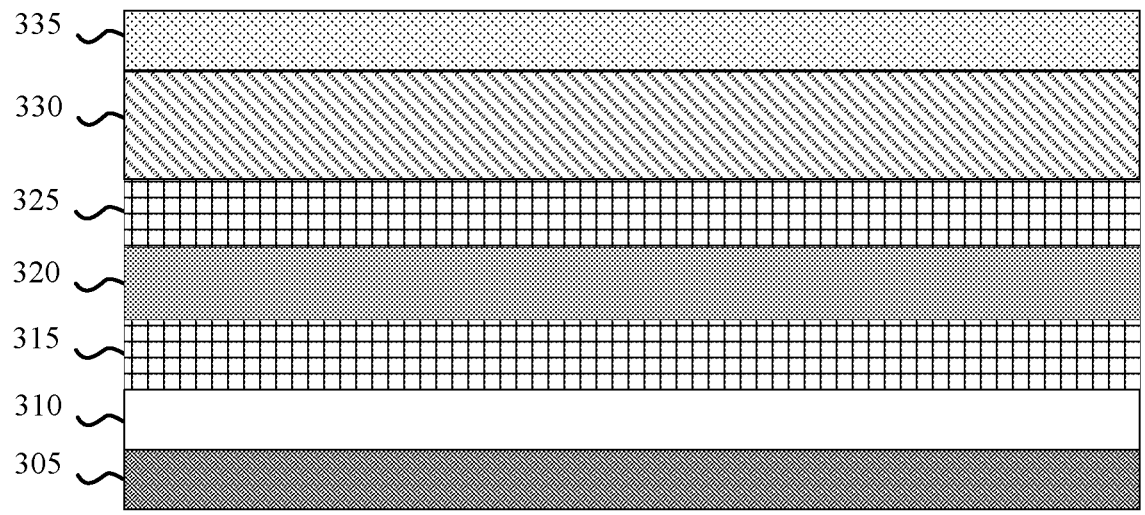

FIG. 3 shows a cross section 300 of a portion a memory device (e.g., memory device 100) after layers of materials have been deposited on a substrate as part of a sequence of processes to fabricate the memory device in accordance with examples of the present disclosure. Various deposition processes may be used to deposit the layers of FIG. 3, including but not limited to chemical vapor deposition (CVD), metalorganic chemical vapor deposition (MOCVD), plasma-enhanced CVD (PECVD), physical vapor deposition (PVD), sputter deposition, atomic layer deposition (ALD), or molecular beam epitaxy (MBE), or any combination thereof, among other techniques.

Cross section 300 includes substrate 305. In some examples, substrate 305 may be a silicon substrate, an insulating substrate such as silicon dioxide or silicon nitride, a polysilicon substrate, other examples, or any combination thereof. In some examples, other components of the memory device may be formed on other portions of substrate 305, such as logic circuitry associated with the memory controller 140, sense component 125, or other components.

Cross section 300 includes a first metal layer 310. First metal layer 310 may be a conductive layer formed by depositing a metal material, such as a material that includes tungsten, aluminum, titanium, titanium nitride, silicon, polysilicon, or any combination thereof, onto substrate 305. First metal layer 310 may correspond to an access line, such as a word line or bit line, that may be used to access one or more memory cells of the memory device.

Cross section 300 includes a first electrode layer 315, cell storage layer 320, and second electrode layer 325. First electrode layer 315 may be formed by depositing a first electrode material, such as a conductive carbon-based material, onto first metal layer 310. Cell storage layer 320 may be formed by depositing a cell storage material onto first electrode layer 315. The cell storage material may be, for example, a variable resistance material, a chalcogenide material, or a phase change material.

Second electrode layer 325 may be formed by depositing a second electrode material onto cell storage layer 320. The second electrode material may be the same material as the first electrode material, for example, or may be a different conductive material, such as a different metal material. Collectively, first electrode layer 315, cell storage layer 320, and second electrode layer 325 may be used to form one or more memory cells, at least some of which if not each of which may be coupled (e.g., connected to, in contact with) with first metal layer 310. The cell storage material may be used as a storage element of the memory cell to store a logic state of the memory cell.

Cross section 300 may include a second metal layer 330. Second metal layer 330 may be formed by depositing a metal material onto second electrode layer 325, for example, during a deposition process. Second metal layer 330 may correspond to an access line, such as a word line or bit line, that may be used to access one or more memory cells. In some examples, if first metal layer 310 corresponds to a word line, second metal layer 330 may correspond to a bit line, or vice versa. First electrode layer 315 and second electrode layer 325 may provide conductive connections to first metal layer 310, or second metal layer 330, or both.

As described herein, second metal layer 330 may be formed using a single deposition process in which a quantity of metal material is deposited. Such an approach may be different than, for example, using multiple separate deposition processes to deposit a first quantity of metal material on second electrode layer 325 during a first deposition process, and to deposit a second quantity of the metal material on the first quantity of metal material during a second deposition process. Depositing second metal layer 330 in a single deposition process may reduce the quantity of fabrication steps that may be used to form a multi-deck memory device relative to a sequence of fabrication steps that includes depositing the second metal layer using two (or more) deposition steps, and may reduce or eliminate the exposure of the cell storage material to metal etchants.

Cross section 300 may include a mask layer 335. Mask layer 335 may be formed by depositing a mask material, such as a nitride hard mask material, onto second metal layer 330 using a deposition process.

Figure 4A:
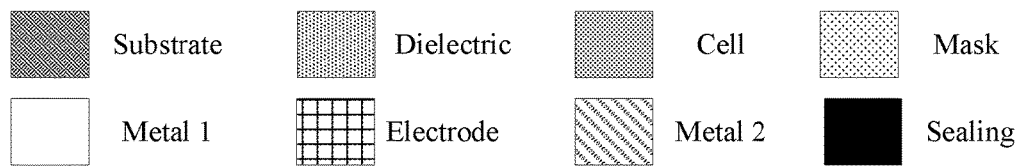
FIGS. 4A and 4B illustrate examples of cross sections of memory devices that support efficient fabrication of memory structures in accordance with examples as disclosed herein.
Figure 4A:
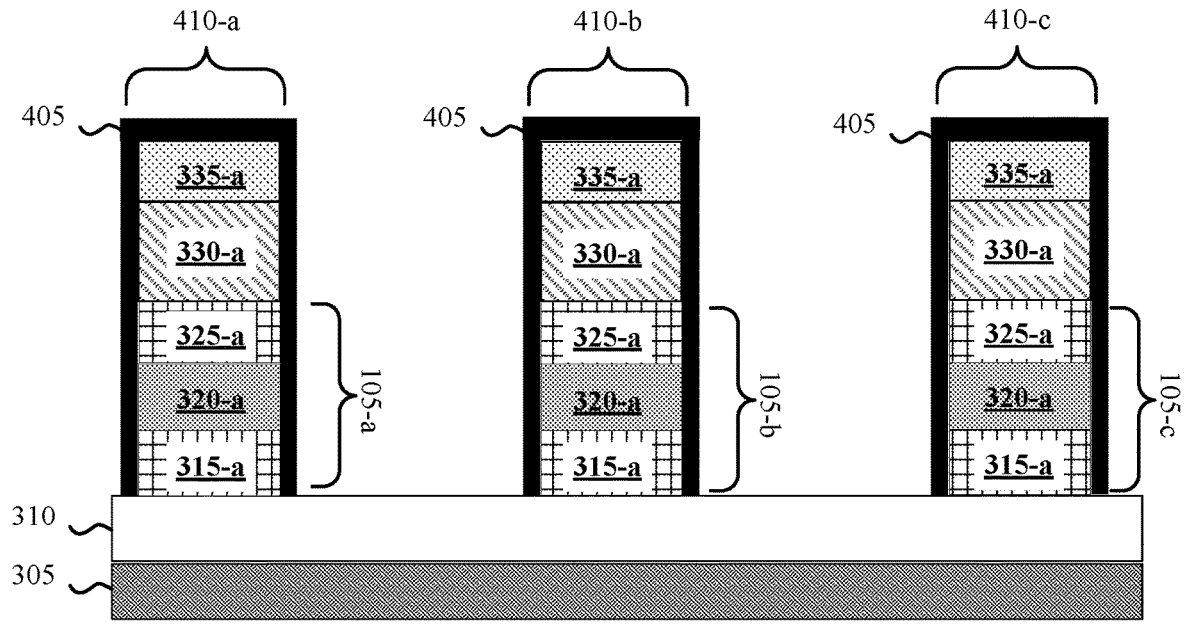
Figure 4B:
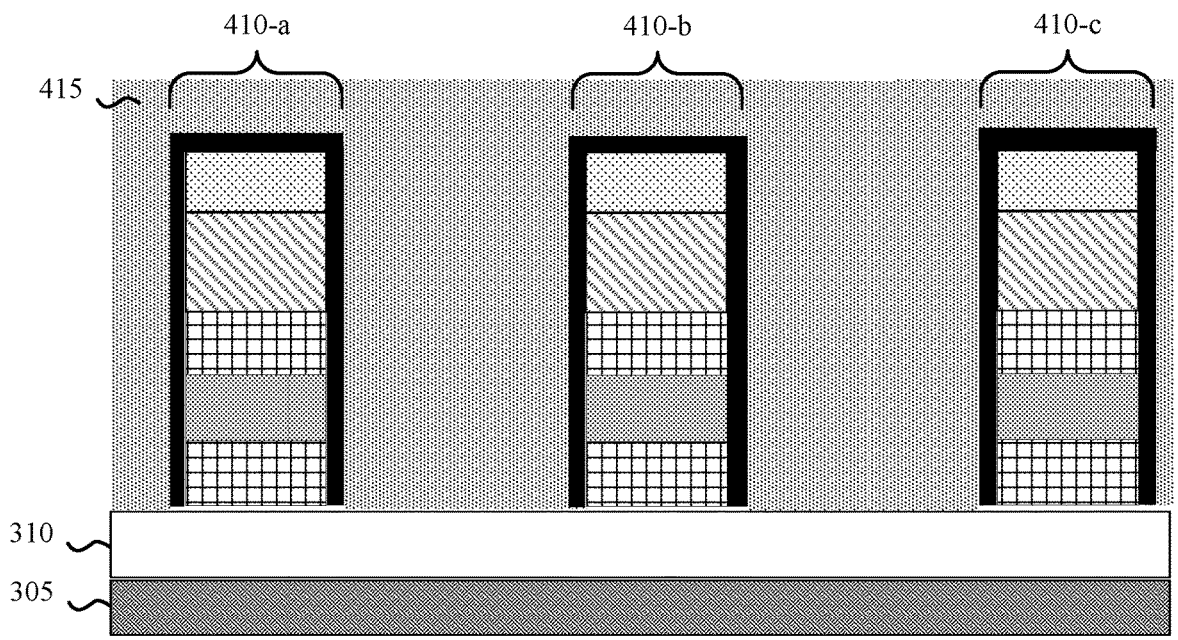

FIGS. 4A and 4B show cross sections 400-a and 400-b of a portion of a memory device (e.g., memory device 100) following several fabrication processes that may be performed after forming cross section 300.

Such fabrication processes may include one or more removal processes, such as etching or planarization processes, to remove a first portion of mask layer 335 and leave a second (e.g., a remaining) portion 335-a of mask layer 335, remove a first portion of second metal layer 330 and leave a second portion 330-a of second metal layer 330, remove a first portion of second electrode layer 325 and leave a second portion 325-a of electrode layer 325, remove a first portion of cell storage layer 320 and leave a second portion 320-a of cell storage layer 320, and remove a first portion of first electrode layer 315 and leave a second portion 315-a of first electrode layer 315. Such etching processes may remove material using a number of techniques, which may include, for example, chemical etching (also referred to as "wet etching"), plasma etching (also referred to as "dry etching"), other examples, or any combination thereof.

FIG. 4A depicts cross section 400-a after such etching process(es) have been completed, and after a sealing material 405 is deposited on one or more surfaces of second portions 335-a, 330-a, 325-a, 320-a, 315-a of mask layer 335, second metal layer 330, second electrode layer 325, cell storage layer 320, and first electrode layer 315, respectively, to form sealed pillars 410-a, 410-b, 410-c. Sealing material 405 may be a nitride sealant, for example, or another type of sealant that may be used to protect one or more of the layers from a subsequent deposition of a dielectric material 415. The sealing material 405 may include, for example, an insulating material such as silicon nitride, silicon oxide, or silicon oxynitride, which may be deposited using one or more of PECVD, CVD, ALD, or spin-on, for example.

FIG. 4B depicts cross section 400-b after dielectric material 415 has been deposited on one or more surfaces of sealed pillars 410 and on a surface of second metal layer 330, such as to fill in an area between sealed pillars 410 to electrically isolate (e.g., insulate) sealed pillars 410 from each other and, in some cases, from other components formed on substrate 305. In some examples, dielectric material 415 may be a spin-on dielectric (SOD) material that may be deposited using a spin coating process. In some examples, dielectric material 415 may include, for example, an insulating material such as silicon nitride, silicon oxide, or silicon oxynitride.

FIGS. 5A and 5B show cross sections 500-a and 500-b of a portion of a memory device (e.g., memory device 100) following several fabrication processes that may be performed after forming cross section 400-b.

FIG. 5A depicts cross section 500-a, which may represent the cross section after performing one or more removal procedures to remove a first portion of the sealing material, a first portion of the dielectric material, and the remaining (second) portion of the first mask layer. In some examples, the one or more removal processes may include a planarization process, such as a chemical-mechanical planarization (CMP), that generates a planar surface 505 that includes a surface 505-a of the second portion of the second metal layer and a surface 505-b of the second portion of the dielectric material. The one or more removal processes may expose the surface 505-*a* of the second portion of the second metal layer.

FIG. 5B depicts cross section 500-*b*, which may represent the cross section of the memory device after one or more deposition processes have been performed on cross section 500-*a*. Such one or more deposition processes may include deposition of electrode material on planar surface 505 (including surface 505-*a* of the second portion of the second metal layer) to form a third electrode layer 510, deposition of cell storage material on third electrode layer 510 to form a second cell storage layer 515, deposition of electrode material on second cell storage layer 515 to form fourth electrode layer 520, and deposition of a mask material on fourth electrode layer 520 to form a second mask layer 525.

Figure 6:
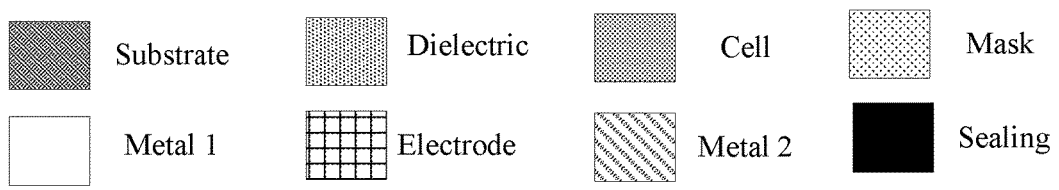
FIG. 6 illustrates an example of a cross section of a memory device that supports efficient fabrication of memory structures in accordance with examples as disclosed herein.
Figure 6:
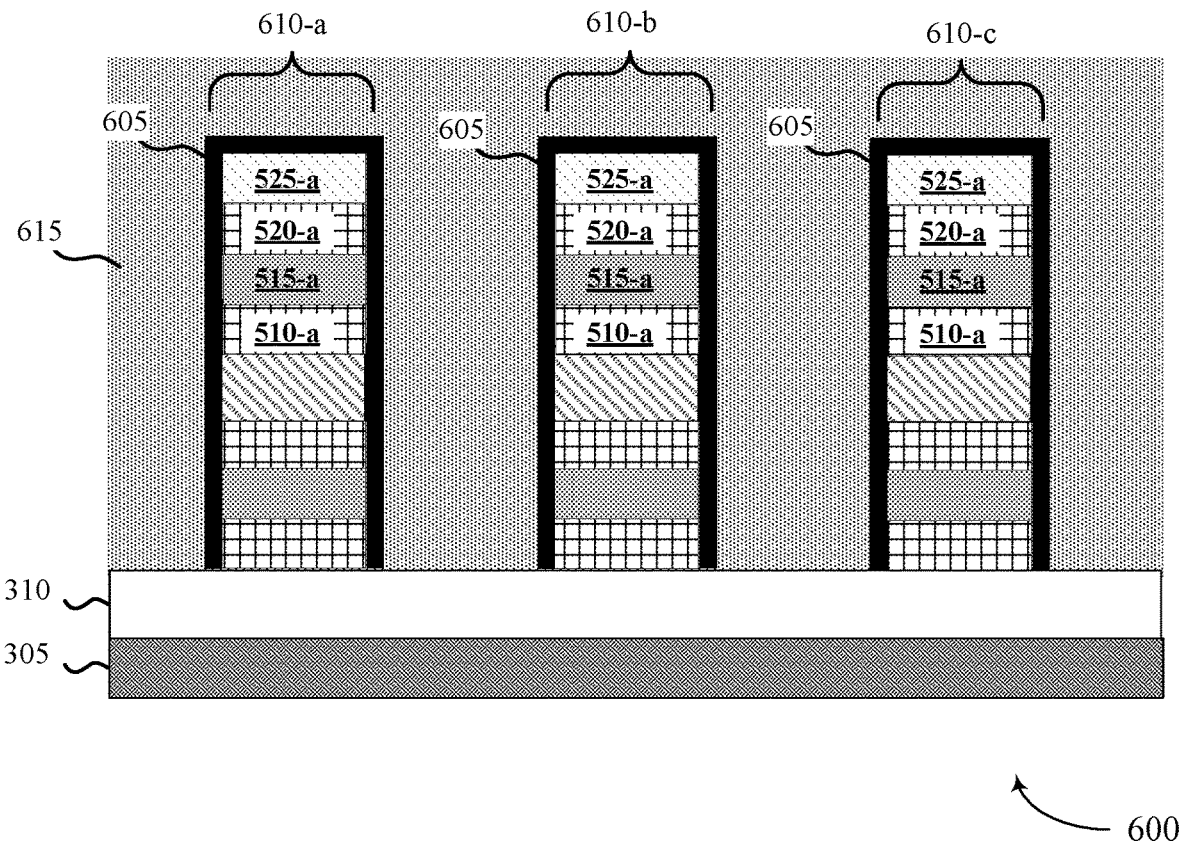

FIG. 6 shows a cross section 600 of a portion of a memory device (e.g., memory device 100) following several fabrication processes that may be performed after forming cross section 500-*b*.

Such fabrication processes may include one or more removal processes, such as etching or planarization processes, to remove a first portion of second mask layer 525 and leave a second portion 525-*a* of mask layer 525, remove a first portion of fourth electrode layer and leave a second portion 520-*a* of fourth electrode layer 520, remove a first portion of second cell storage layer 515 and leave a second portion 515-*a* of second cell storage layer 515, and remove a first portion of third electrode layer 510 and leave a second portion 510-*a* of third electrode layer 510.

Such fabrication processes may include deposition of a sealing material 605 on one or more surfaces of second portions 525-*a*, 520-*a*, 515-*a*, and 510-*a* of mask layer 525, fourth electrode layer 520, second cell storage layer 515, and third electrode layer 510, respectively, to form sealed pillars 610-*a*, 610-*b*, 610-*c*. Sealing material 605 may be a nitride sealing material, for example, or another type of sealing material that may be used to protect one or more of the layers from a subsequent deposition of a dielectric material 615. The sealing material 605 may be the same sealing material as sealing material 405 or may be a different sealing material.

Such fabrication processes may include deposition of a dielectric material 615 on one or more surfaces of sealed pillars 610 and on a surface of second metal layer 330, such as to fill in an area between sealed pillars 610 to electrically isolate (e.g., insulate) sealed pillars 610 from each other and, in some cases, from other components formed on substrate 305. In some examples, dielectric material 615 may be an SOD material that may be deposited using a spin coating process. In some examples, dielectric material 615 may include, for example, an insulating material such as silicon nitride, silicon oxide, or silicon oxynitride.

Figure 7A:
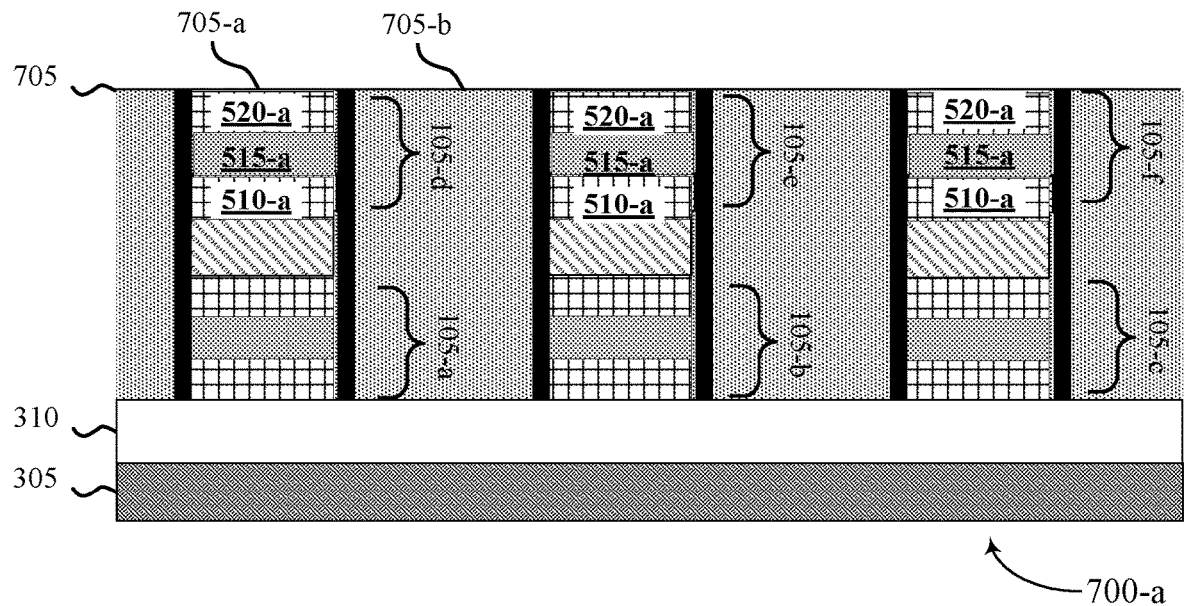
FIGS. 7A and 7B illustrate examples of cross sections of memory devices that support efficient fabrication of memory structures in accordance with examples as disclosed herein.
Figure 7B:
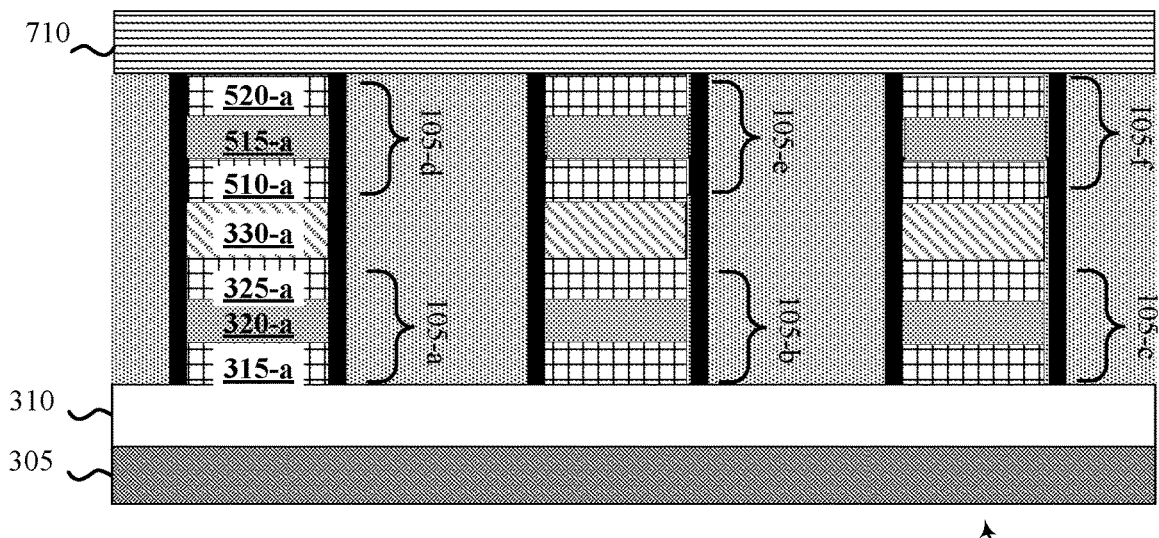

FIGS. 7A and 7B show cross sections 700-*a* and 700-*b* of a portion of a memory device (e.g., memory device 100) following several fabrication processes that may be performed after forming cross section 600.

FIG. 7A depicts cross section 700-*a*, which may represent a cross section of the memory device after performing a removal procedure to remove a first portion of the sealing material, a first portion of the dielectric material, and the remaining (e.g., second) portion of the second mask layer. In some examples, the removal process may include a planarization process, such as a CMP, that generates a planar surface 705 that includes a surface 705-*a* of the second (e.g., remaining) portion 520-*a* of the third electrode layer and a surface 705-*b* of the second (e.g., remaining) portion of the dielectric material.

Cross section 700-*a* includes memory cells 105-*d*, 105-*e*, and 105-*f*, which may be stacked over memory cells 105-*a*, 105-*b*, and 105-*c*, respectively to form two decks of memory cells. Memory cells 105-*d* and 105-*a* may share an access line corresponding to metal layer 330, for example.

FIG. 7B depicts cross section 700-*b*, which may represent the cross section of the memory device after one or more deposition processes have been performed on cross section 700-*a*. Such deposition processes may include deposition of a metal material on planar surface 705 (including surface 705-*a* of second portion 520-*a* of the fourth electrode layer 520 and surface 705-*b* of a second portion of the dielectric layer) to form a third metal layer 710. Third metal layer 710 may correspond to an access line, such as a word line or bit line, used to access memory cells 105-*d*, 105-*e*, and 105-*f*, for example.

In some examples, first metal layer 310 may correspond to a word line, second portion 330-*a* of metal layer 330 may correspond to a bit line, and third metal layer 710 may correspond to a word line. For example, memory cell 105-*a* may be accessed by activating a first word line corresponding to first metal layer 310 and a bit line corresponding to second portion 330-*a* of second metal layer 330. Memory cell 105-*f* may be accessed by activating the bit line corresponding to second portion 330-*a* of second metal layer 330 and a second word line corresponding to third metal layer 710. Word lines and bit lines may be interchanged in this example without departing from the scope of the invention.

Figure 8:
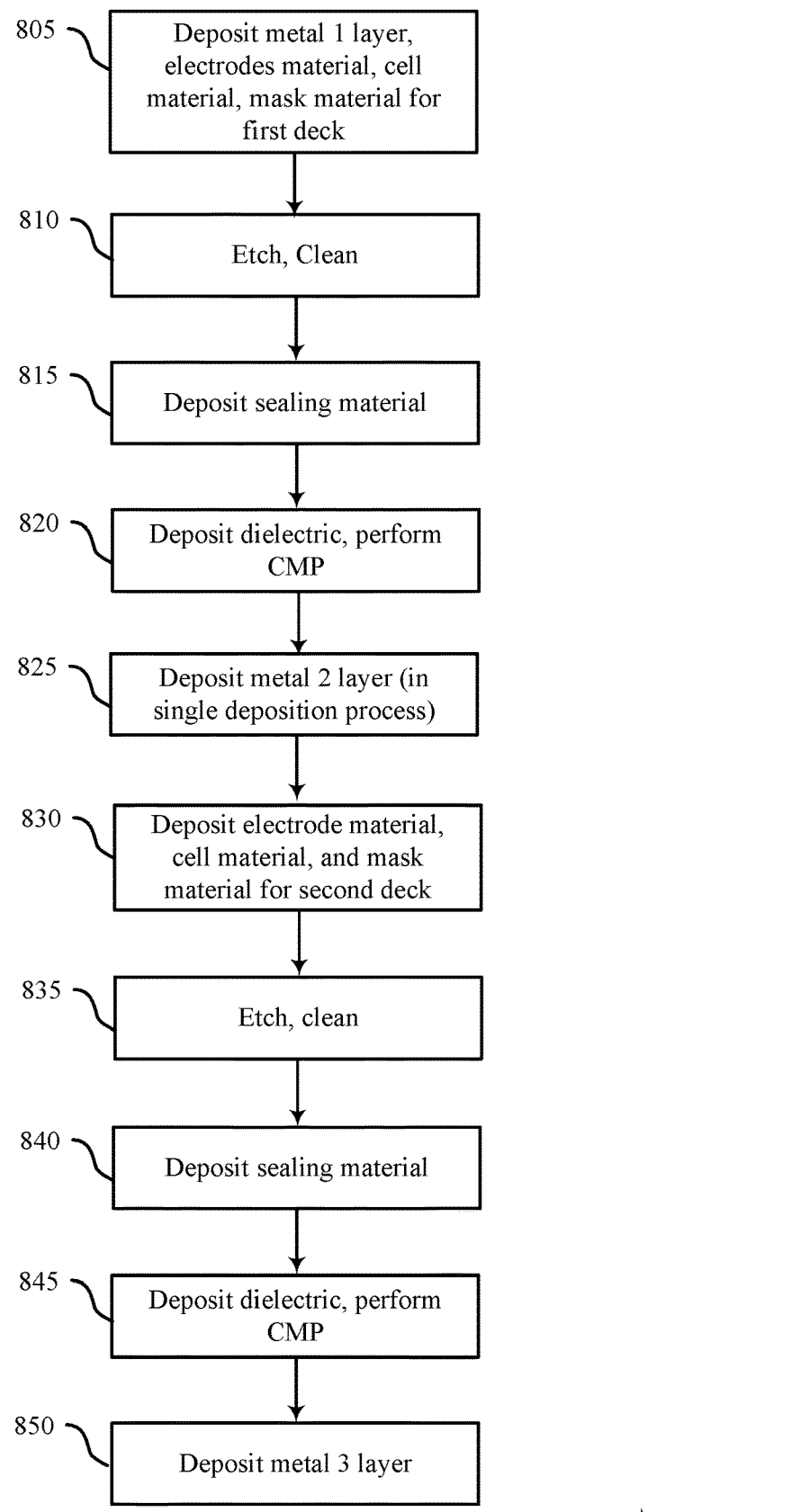
FIG. 8 shows a flow diagram that supports efficient fabrication of memory structures in accordance with aspects of the present disclosure.

FIG. 8 illustrates a flow diagram 800 that may be used to fabricate the cross sections shown in FIGS. 3 through 7.

At 805, one or more one or more deposition tool(s) may be used to form layers for a first memory deck of a memory device. In some examples, the deposition tool(s) may deposit layers on a substrate such as illustrated in FIG. 3.

In some cases, the substrate may be a semiconductor substrate (e.g., a silicon wafer). In some cases, the deposition tool(s) may include a metallization deposition tool that deposits a metal material to form a first metal layer (e.g., first metal layer 310), an electrode layer deposition tool that deposits electrode material to form a first electrode layer (e.g., first electrode layer 315), a cell storage material deposition tool that deposits cell storage material to form a first cell storage layer (e.g., first cell storage layer 320), the electrode layer deposition tool that deposits a second electrode layer (e.g., second electrode layer 325), and a mask deposition tool that deposits a mask material to form the first mask layer (e.g., first mask layer 335). The deposition tools may include one or more of a CVD tool, a MOCVD tool, a PECVD tool, PVD tool, a sputter deposition tool, an ALD, a MBE tool, a spin-on tool, or other thin film deposition tool.

Following deposition of the layers for the memory deck, one or more patterning tool(s) may deposit and pattern an etch mask into set of etch mask lines, which may include etch masked rows or etch masked columns depending upon the memory deck that is to be etched. Such an etch mask may comprise a photoresist, a dielectric, or other material that is relatively easy to etch into a line pattern, for example. Patterning may be performed using photolithography (e.g., direct print, expose/shift/expose, expose/positive develop/ negative develop), photolithography with pitch doubling process (e.g., spacers), and imprinting, just to name a few examples.

At 810, one or more etching tool(s) may be used to etch the layers of the memory deck formed at 805 to form a first deck of rows and columns of memory cells. In some embodiments, a plasma etch process, wet etch process, dry etch process, or a combination thereof may be used. The etch mask may be removed, in some examples, (e.g., via a wet photoresist removal process). In other examples, the etch mask may remain on the top of the memory deck layers and used as a sacrificial layer in a subsequent planarization process. In some examples, the remaining portions of the layers may then be cleaned to remove byproducts from the etching.

At 815, after the etching and cleaning processes are completed, sealing material (e.g., sealing material 405) may be deposited by a sealing tool(s) on the rows or columns of the memory deck layers to form sealed pillars (e.g., sealed pillars 410). The sealing tool(s) may include processing equipment that may deposit the sealing material (e.g., a nitride material) using a CVD or PECVD process, or any other thin film deposition process.

At 820, a dielectric material may be deposited on the sealed pillars using a dielectric filling tool(s). The dielectric filling tool(s) may include processing equipment that may deposit a dielectric material (e.g., $SiO_2$) using a CVD or PECVD process, or any other thin film deposition process. A planarization tool(s) may then be used to planarize the first memory deck by removing a portion of the sealing material, masking material, and dielectric filling material. The planarization tool(s) may include, for example, CMP processing equipment that may planarize the memory deck, thus leaving rows or columns of the memory deck layers, such as illustrated in FIG. 5A.

At 825, a deposition tool may be used to deposit, in a single deposition process, a metal material onto the planarized first memory deck to form a second metal layer (e.g., second metal layer 330). That is, a quantity of the metal material may be deposited during the single deposition process, and the second metal layer my include the quantity of metal material and exclude any additional metal material.

At 830, a deposition tool(s) may be used to form layers of a second memory deck. The deposition tool(s) may deposit electrode material to form a third electrode layer (e.g., third electrode layer 510), deposit cell storage material to form a second cell storage layer (e.g., second cell storage layer 515-a), deposit electrode material to form a fourth electrode layer (e.g., fourth electrode layer 520), and deposit mask material to form a second mask layer (e.g., second mask layer 525).

At 835, one or more etching tool(s) may be used to etch the layers formed at 830 to form a second deck of rows and columns of memory cells and clean the remaining layers in a manner similar to that described for 810. The second deck of rows and columns of memory cells may be stacked on the first deck of rows and columns of memory cells to stacks of memory cells.

At 840, after the etching and cleaning processes are completed, sealing material (e.g., sealing material 605) may be deposited by a sealing tool(s) on the rows or columns of the second memory deck layers to form sealed pillars (e.g., sealed pillars 610) in a manner similar to that described for 815.

At 845, a dielectric material may be deposited on the sealed pillars using a dielectric filling tool(s), and a planarization tool(s) may then be used to planarize the second memory deck by removing a portion of the sealing material, masking material, and dielectric filling material of the second memory deck.

At 850, a deposition tool may be used to deposit a metal material onto the planarized second memory deck to form a third metal layer (e.g., third metal layer 710).

In some examples, flow diagram 800 may depict a sequence of fabrication processes that may reduce the quantity of fabrication processes that may be used to fabricate a multi-deck memory device by using a single deposition step to deposit a second metal layer rather than depositing the second metal layer using two deposition processes. Such an approach may eliminate not only the second deposition process associated with depositing the second metal layer in other different processes separate from the present disclosure, but may also eliminate additional processing steps that may be used for patterning and aligning the subsequent processing steps, among other benefits.

Figure 9:
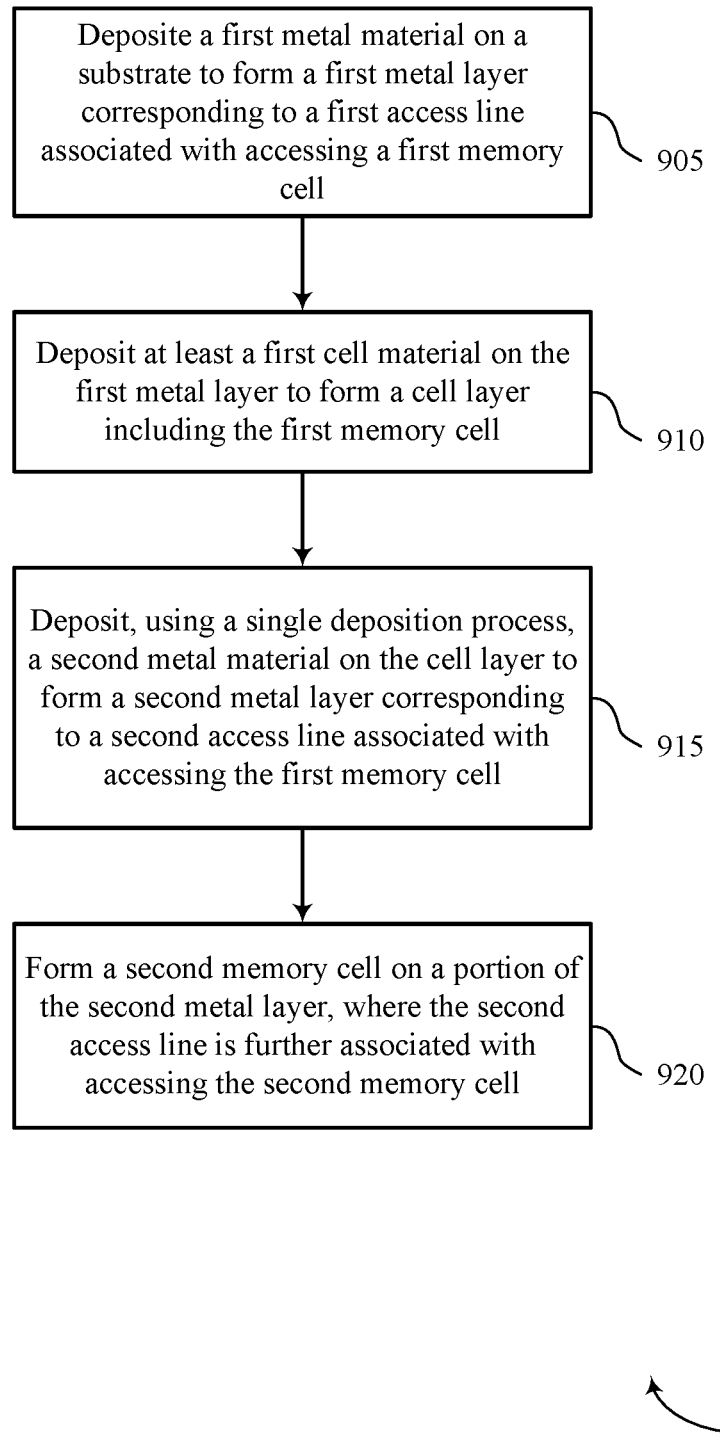
FIG. 9 shows a flowchart illustrating a method or methods that support efficient fabrication of memory structures in accordance with examples as disclosed herein.

FIG. 9 shows a flowchart illustrating a method or methods 900 that supports efficient fabrication of memory structures in accordance with aspects of the present disclosure. The operations of method 900 may be implemented by a fabrication device or its components as described herein. For example, the operations of method 900 may be performed by one or more of an etching tool, deposition tool, planarization tool, or other tool as described with reference to FIG. 8. In some examples, a fabrication device may execute a set of instructions to control the functional elements of the fabrication device to perform the described functions. Additionally, or alternatively, a fabrication device may perform aspects of the described functions using special-purpose hardware.

At 905, the fabrication device may deposit a first metal material on a substrate to form a first metal layer corresponding to a first access line associated with accessing a first memory cell. The operations of 905 may be performed according to the methods described herein. In some examples, aspects of the operations of 905 may be performed by a deposition tool as described with reference to FIG. 8.

At 910, the fabrication device may deposit at least a first cell material on the first metal layer to form a cell layer including the first memory cell. The operations of 910 may be performed according to the methods described herein. In some examples, aspects of the operations of 910 may be performed by a deposition tool as described with reference to FIG. 8.

At 915, the fabrication device may deposit, using a single deposition process, a second metal material on the cell layer to form a second metal layer corresponding to a second access line associated with accessing the first memory cell. The operations of 915 may be performed according to the methods described herein. In some examples, aspects of the operations of 915 may be performed by a deposition tool as described with reference to FIG. 8.

At 920, the fabrication device may form a second memory cell on a portion of the second metal layer, where the second access line is further associated with accessing the second memory cell. The operations of 920 may be performed according to the methods described herein. In some examples, aspects of the operations of 920 may be performed by a deposition tool, etching tool, planarization tool, and/or other tools as described with reference to FIG. 6.

In some examples, an apparatus as described herein may perform a method or methods, such as the method 900. The apparatus may include features, means, or instructions (e.g., a non-transitory computer-readable medium storing instructions executable by a processor) for depositing a first metal material on a substrate to form a first metal layer corresponding to a first access line associated with accessing a first memory cell, depositing at least a first cell material on the first metal layer to form a cell layer including the first memory cell, depositing, using a single deposition process, a second metal material on the cell layer to form a second metal layer corresponding to a second access line associated with accessing the first memory cell, and forming a second memory cell on a portion of the second metal layer, where the second access line is further associated with accessing the second memory cell.

In some examples of the method 900 and the apparatus described herein, depositing the at least the first cell material may include operations, features, means, or instructions for depositing a first electrode material on the first metal layer to form a first electrode layer, depositing a cell storage material on the first electrode layer to form a cell storage layer, and depositing a second electrode material on the cell storage layer to form a second electrode layer.

Some examples of the method 900 and the apparatus described herein may further include operations, features, means, or instructions for depositing, before forming the second memory cell, a first mask material on the second metal layer to form a first mask layer, performing a first etching process before forming the second memory cell to remove a first portion of the first mask layer, a first portion of the second metal layer, a first portion of the first electrode layer, a first portion of the cell storage layer, and a first portion of the second electrode layer, and where the first memory cell includes a second portion of the first electrode layer, a second portion of the cell storage layer, and a second portion of the second electrode layer.

Some examples of the method 900 and the apparatus described herein may further include operations, features, means, or instructions for depositing, after performing the first etching process, a sealing material on a surface of a first stack including a remaining portion of the first mask layer, a remaining portion of the first metal layer, and the first memory cell, and performing a removal procedure to remove a first portion of the sealing material and the remaining portion of the first mask layer to expose a surface of the remaining portion of the second metal layer, where forming the second memory cell on the second metal layer includes forming the second memory cell on the surface of the second metal layer.

Some examples of the method 900 and the apparatus described herein may further include operations, features, means, or instructions for depositing a dielectric material on the sealing material before performing the removal procedure, where the performing the removal procedure includes removing a first portion of the dielectric material.

In some examples of the method 900 and the apparatus described herein, performing the removal procedure may include operations, features, means, or instructions for performing a planarization process to generate a planar surface including the surface of the second portion of the second metal layer and a surface of a second portion of the dielectric material.

In some examples of the method 900 and the apparatus described herein, forming the second memory cell may include operations, features, means, or instructions for depositing the first electrode material on the planar surface to form a third electrode layer, depositing the cell storage material on the third electrode layer to form a second cell storage layer, depositing the second electrode material on the second cell storage layer to form the second electrode layer, depositing the first mask material on the second electrode layer to form a second mask layer, and performing a second etching process to remove a first portion of the second mask layer, a first portion of the third electrode layer, a first portion of the second cell storage layer, and a first portion of a fourth electrode layer, where the second memory cell includes a remaining portion of the third electrode layer, a remaining portion of the second cell storage layer, and a remaining portion of the fourth electrode layer.

Some examples of the method 900 and the apparatus described herein may further include operations, features, means, or instructions for depositing, after performing the second etching process, a second sealing material on a surface of a second stack including a remaining portion of the second mask layer and the second memory cell, depositing a second dielectric material on the second sealing material, and performing a second removal procedure to remove a first portion of the second sealing material, the remaining portion of the second mask layer, and a first portion of the second dielectric material to expose a second surface.

Some examples of the method 900 and the apparatus described herein may further include operations, features, means, or instructions for depositing a third metal material on the second surface to form a third metal layer corresponding to a third access line associated with accessing the second memory cell.

In some examples of the method 900 and the apparatus described herein, the first electrode material includes a conductive carbon material and the second electrode material includes the conductive carbon material.

In some examples of the method 900 and the apparatus described herein, the cell storage material includes a chalcogenide material.

In some examples of the method 900 and the apparatus described herein, the second metal layer includes a quantity of the second metal material deposited using the single deposition process and excludes any additional quantity of the second metal material.

In some examples of the method 900 and the apparatus described herein, the first metal material and the second metal material include tungsten.

It should be noted that the methods described above describe possible implementations, and that the operations and the steps may be rearranged or otherwise modified and that other implementations are possible. Furthermore, portions from two or more of the methods may be combined.

An apparatus is described. The apparatus may include a first metal layer formed on a substrate based on a first deposition process, the first metal layer corresponding to a first access line associated with accessing a first memory cell, the first memory cell formed on the first metal layer, a second metal layer formed, using a single second deposition process, on the first memory cell, the second metal layer corresponding to a second access line associated with the first memory cell, and a second memory cell formed on the second metal layer.

In some examples, the second access line may be further associated with accessing the second memory cell.

In some examples, the single second deposition process includes a deposition of a quantity of a metal material and excludes any additional quantity of the metal material.

Some examples of the apparatus may include a third metal layer formed on the second memory cell, the third metal layer corresponding to a third access line associated with accessing the second metal layer.

In some examples, the first memory cell includes a chalcogenide material for storing a state of the first memory cell.

In some examples, the first metal layer and the second metal layer include tungsten.

In some examples, the first access line includes a word line or a bit line. In some examples, the second access line includes a word line or a bit line.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The term "layer" or "level" used herein refers to a stratum or sheet of a geometrical structure (e.g., relative to a substrate). Each layer or level may have three dimensions (e.g., height, width, and depth) and may cover at least a portion of a surface. For example, a layer or level may be a three dimensional structure where two dimensions are greater than a third, e.g., a thin-film. Layers or levels may include different elements, components, and/or materials. In some examples, one layer or level may be composed of two or more sublayers or sublevels that may be deposited during two or more deposition processes.

As used herein, the term "electrode" may refer to an electrical conductor, and in some examples, may be employed as an electrical contact to a memory cell or other component of a memory array. An electrode may include a trace, wire, conductive line, conductive layer, or the like that provides a conductive path between elements or components of a memory array.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus, comprising:
   a first metal layer formed over a substrate based at least in part on a first deposition process, the first metal layer corresponding to a first access line associated with accessing a first memory cell;
   the first memory cell formed over the first metal layer;
   a second metal layer formed, using a single second deposition process, over the first memory cell, the second metal layer corresponding to a second access line associated with the first memory cell;
   a second memory cell formed over the second metal layer;
   a first sealant layer on a first portion of the first metal layer, a first portion of the first memory cell, a first portion of the second metal layer, and a first portion of the second memory cell; and
   a second sealant layer on a second portion of the first metal layer, a second portion of the first memory cell, a second portion of the second metal layer, and a second portion of the second memory cell.

2. The apparatus of claim 1, wherein the second access line is further associated with accessing the second memory cell.

3. The apparatus of claim 1, wherein the single second deposition process comprises a deposition of a quantity of a metal material and excludes any additional quantity of the metal material deposited as part of another deposition process.

4. The apparatus of claim 1, wherein a thickness of the first metal layer is less than a thickness of the second metal layer based at least in part on the single second deposition process.

5. The apparatus of claim 1, wherein:
   the first memory cell comprises a portion of a first electrode layer, a portion of a first cell storage layer, and a portion of a second electrode layer, and
   the second memory cell comprises a portion of a third electrode layer, a portion of a second cell storage layer, and a portion of a fourth electrode layer.

6. The apparatus of claim 1, further comprising:
   a third metal layer formed over the second memory cell, the third metal layer corresponding to a third access line associated with accessing the second metal layer.

7. The apparatus of claim 1, wherein the second metal layer is formed based at least in part on a first mask layer formed over the second metal layer, the first mask layer associated with a first etching process to remove a first portion of the first mask layer, a first portion of the second metal layer, and a first portion of a material forming the first memory cell.

8. The apparatus of claim 1, wherein the first memory cell comprises a chalcogenide material for storing a state of the first memory cell.

9. The apparatus of claim 1, wherein the first metal layer and the second metal layer comprise tungsten.

10. The apparatus of claim 1, wherein the first access line comprises a word line or a bit line.

11. The apparatus of claim 1, wherein the second access line comprises a word line or a bit line.

12. The apparatus of claim 1, wherein the single second deposition process comprises a deposition of a quantity of a metal material of the second metal layer that is greater than 55 nanometers.

13. The apparatus of claim 12, wherein a thickness of the first metal layer is less than 55 nanometers.

14. A memory device, comprising:
a plurality of pillars arranged in a three-dimensional cross-point architecture, each pillar comprising:
a first memory cell coupled with a first access line and with a second access line;
a second memory cell coupled with the second access line and with a third access line, wherein the second access line comprises a quantity of a metal material deposited during a single deposition process;
a first sealant layer on a first portion of the first access line, a first portion of the first memory cell, a first portion of the second access line, and a first portion of the second memory cell; and
a second sealant layer on a second portion of the first access line, a second portion of the first memory cell, a second portion of the second access line, and a second portion of the second memory cell.

15. The memory device of claim 14, wherein the first access line, the second access line, and the third access line each correspond to one of a word line or a bit line.

16. The memory device of claim 14, wherein the first access line comprises a second quantity of the metal material deposited during a second deposition process before the single deposition process.

17. The memory device of claim 14, wherein a thickness of the first access line is less than a thickness of the second access line based at least in part on the single deposition process.

18. The memory device of claim 14, wherein the first memory cell comprises a chalcogenide material for storing a state of the first memory cell, and the metal material comprises tungsten.

19. The memory device of claim 14, wherein the single deposition process comprises depositing a quantity of the metal material that is greater than 55 nanometers.

* * * * *